United States Patent
Lakdawala et al.

(10) Patent No.: US 9,660,798 B2
(45) Date of Patent: May 23, 2017

(54) DIRECT DIGITAL FREQUENCY GENERATION USING TIME AND AMPLITUDE

(71) Applicant: Intel IP Corporation, Santa Clara, CA (US)

(72) Inventors: Hasnain Lakdawala, Portland, OR (US); Ashoke Ravi, Hillsboro, OR (US); Ofir Degani, Haifa (IL); Bernd-Ulrich Klepser, Starnberg (DE); Zdravko Boos, Munich (DE); Georgios Palaskas, Portland, OR (US); Stefano Pellerano, Beaverton, OR (US); Paolo Madoglio, Beaverton, OR (US)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 14/997,056

(22) Filed: Jan. 15, 2016

(65) Prior Publication Data

US 2016/0261401 A1    Sep. 8, 2016

Related U.S. Application Data

(63) Continuation of application No. 14/138,508, filed on Dec. 23, 2013, now Pat. No. 9,288,841.

(51) Int. Cl.
*H04L 27/36* (2006.01)
*H04L 27/12* (2006.01)
(Continued)

(52) U.S. Cl.
CPC ............ *H04L 7/033* (2013.01); *H03L 7/16* (2013.01); *H04B 7/0413* (2013.01); *H04B 7/06* (2013.01);
(Continued)

(58) Field of Classification Search
USPC ........................................................ 375/299
See application file for complete search history.

(56) References Cited

U.S. PATENT DOCUMENTS 8,339,295 B2 * 12/2012 Nagaraj ................. H03B 21/02
                                                            327/105
9,288,841 B2    3/2016 Lakdawala et al.
(Continued)

FOREIGN PATENT DOCUMENTS

CN    104836761 A    8/2015
DE    102013113495 A1    6/2015
DE    102014017296 A1    6/2015

OTHER PUBLICATIONS

"U.S. Appl. No. 14/138,508, Final Office Action mailed Jul. 8, 2015", 12 pgs.

(Continued)

*Primary Examiner* — Qutbuddin Ghulamali
(74) *Attorney, Agent, or Firm* — Schwegman Lundberg & Woessner, P.A.

(57) ABSTRACT

This application discusses, among other things, apparatus and methods for sharing a local oscillator between multiple wireless devices. In certain examples, an apparatus can include a central frequency synthesizer configured to provide a central oscillator signal having a first frequency, a first transmitter, the first transmitter including a first transmit digital-to-time converter (DTC) configured to receive the central oscillator signal and to provide a first transmitter signal having a second frequency, and a first receiver, the first receiver including a first receive DTC configured to receive the central oscillator signal and to provide a first receiver signal having a first receive frequency.

20 Claims, 9 Drawing Sheets

(51) Int. Cl.
| | |
|---|---|
| *H04L 7/033* | (2006.01) |
| *H04B 7/06* | (2006.01) |
| *H04L 27/20* | (2006.01) |
| *H04W 88/06* | (2009.01) |
| *H03L 7/16* | (2006.01) |
| *H04B 7/0413* | (2017.01) |
| *H04L 27/152* | (2006.01) |
| *H03K 5/00* | (2006.01) |

(52) U.S. Cl.
CPC ........... *H04L 27/152* (2013.01); *H04L 27/20* (2013.01); *H04W 88/06* (2013.01); *H03K 2005/00234* (2013.01); *H04L 27/1525* (2013.01)

(56) References Cited

U.S. PATENT DOCUMENTS

| | | |
|---|---|---|
| 2005/0186920 A1 | 8/2005 | Staszewski et al. |
| 2007/0111679 A1 | 5/2007 | Thompson et al. |
| 2008/0056337 A1* | 3/2008 | Tal .......... H03B 21/02 375/219 |
| 2013/0287137 A1* | 10/2013 | Menkhoff .......... H04L 27/2601 375/295 |
| 2014/0002287 A1 | 1/2014 | Klepser et al. |
| 2014/0266455 A1* | 9/2014 | Kaatz ..................... H03F 1/565 330/286 |
| 2015/0181643 A1 | 6/2015 | Lakdawala et al. |

OTHER PUBLICATIONS

"U.S. Appl. No. 14/138,508, Non Final Office Action mailed Mar. 11, 2015", 11 pgs.
"U.S. Appl. No. 14/138,508, Notice of Allowance mailed Oct. 2, 2015", 9 pgs.
"U.S. Appl. No. 14/138,508, Response filed Jun. 11, 2015 to Non Final Office Action mailed Mar. 11, 2015", 11 pgs.
"U.S. Appl. No. 14/138,508, Response filed Sep. 14, 2015 to Final Office Action mailed Jul. 8, 2015", 10 pgs.
"German Application Serial No. 102014017296.1, Office Action mailed Apr. 21, 2016", 23 pgs.

* cited by examiner

DIRECT DIGITAL FREQUENCY GENERATION USING TIME AND AMPLITUDE

CLAIM OF PRIORITY AND RELATED APPLICATIONS

This application is a continuation of, and claims the benefit of priority to, Lakdawala et al., U.S. patent application Ser. No. 14/138,508, titled, "DIRECT DIGITAL FREQUENCY GENERATION USING TIME AND AMPLITUDE", filed Dec. 23, 2013, now issued as U.S. Pat. No. 9,288,841, which is hereby incorporated by reference herein in its entirety.

TECHNICAL FIELD

Examples described herein refer to synthetic signal generation, and more particularly, to synthetic frequency signal generation.

BACKGROUND

Multi-standard radios, such as cell phones and other electronic devices, require multiple signals having different frequencies to be able to transmit and receive information from different frequency bands. Due to carrier aggregation in cellular communication technologies, newer radio will be capable of operating multiple radios simultaneously. Present topologies have an individual synthesizer associated with each different frequency signal.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Multi-standard radios, such as cell phones and other electronic devices, require multiple signals having different frequencies to be able to transmit and receive information from different frequency bands. Due to carrier aggregation in cellular communication technologies, newer mobile devices will be capable of operating multiple radios simultaneously. Present topologies have a separate oscillator and synthesizer associated with each different frequency signal. Current multi-radio architectures pressure the devices to be larger to accommodate the additional oscillators. The additional oscillators also use additional power that can substantially reduce the time between recharging of the energy storage device of mobile devices without making accommodations for a larger energy storage device.

Recent developments in standards and technology have introduced the concept of carrier aggregation and amplifiers integrated with the transmitters or transceivers. These technological improvements have come with costs. For example, the oscillator in each radio PLL of current designs can experience "pulling" from the high power modulated power amplifier outputs. "Pulling" from the power amplifier to the local oscillator (e.g., re-modulation) can result in degraded modulation quality and spectral performance. The pulling problem can be exacerbated with multi-input/multi-output (MIMO) transmitters where the multiple independently modulated power amplifiers at the same frequency can "pull" the transmitter modulation PLLs. The oscillator in the PLLs for each MIMO or carrier aggregation branch can pull one another as well.

Figure 1:
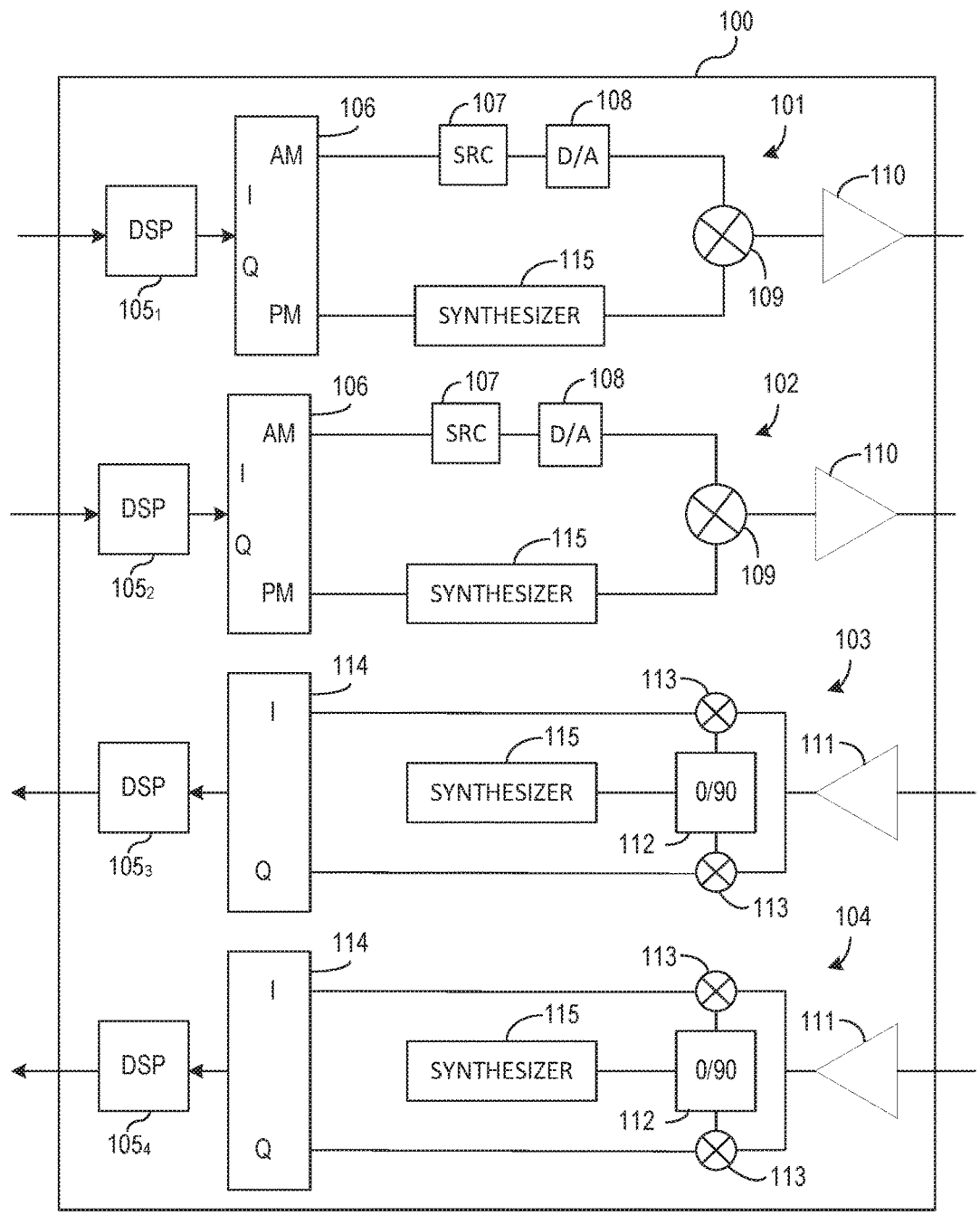
FIG. 1 illustrates generally a multi-radio device including two transmitter devices and two receiver devices.

FIG. 1 illustrates generally a multi-radio device 100 including two transmitter devices 101, 102 and two receiver devices 103, 104. Each device can include a processor such as a digital signal processor (DSP) 105$_n$. The transmitter devices 101, 102 can include a transmitter, such as a Cartesian transmitter or a polar transmitter including a cordic converter 106, sample rate converter 107, digital-to-analog converter (DAC) 108, a mixer 109, and a power amplifier 110 Each receiver device 103, 104 can include a receiver amplifier 111, a phase shifter 112, one or more mixers 113 and a demodulator 114. Each device also includes a synthesizer 115 to generate a local oscillator (LO) signal associated with the wireless signal generated by a transmitter device 101, 102 or received by a receiver device 103, 104. As discussed above, having a synthesizer 115 for each device 101, 102, 103, 104 can limit the ability of multi-radio devices to miniaturize. In addition, each synthesizer 115, as well as, the power amplifiers of each radio can influence or pull the frequency of other synthesizer devices diminishing the devices performance or fidelity. Therefore, it can be customary to maximize distance between the synthesizers 115 which can also limit miniaturization of multi-radio devices.

The present inventors have recognized a synthetic frequency synthesis architecture that allows multiple frequency generation using a central frequency synthesizer such as a single central phase-locked loop (PLL), for example. The architecture allows selection of a central PLL frequency to be at a power efficient frequency. Frequencies for each radio of the device can be generated with a power efficient direct digital frequency synthesizer using the output of the central PLL. The direct digital frequency synthesizers can use time and voltage information to reduce phase noise, improve performance, and decouple the traditional mechanism that allows the power amplifier to "pull" the local oscillator. An unexpected development of solving the "pulling" problem, the inventors have also recognized that a central PLL architecture that exploits the digital phase shifting capabilities of a digital-to-time converter (DTC) can significantly reduce circuit real estate in transmitter/receiver radios and more so in MIMO devices having multiple transmitters, multiple receivers, or combinations of multiple transmitters and multiple receivers.

Figure 2A:
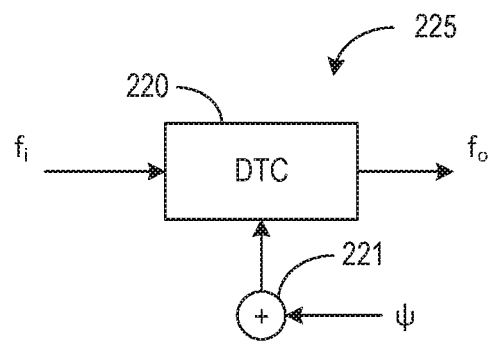
FIGS. 2A-2C illustrate generally example frequency synthesizers or frequency generators that can include a digital-to-time converter (DTC).
Figure 2B:
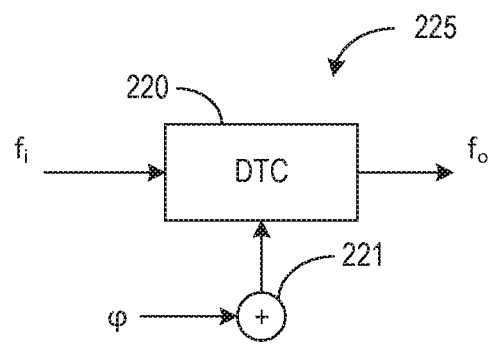
Figure 2C:
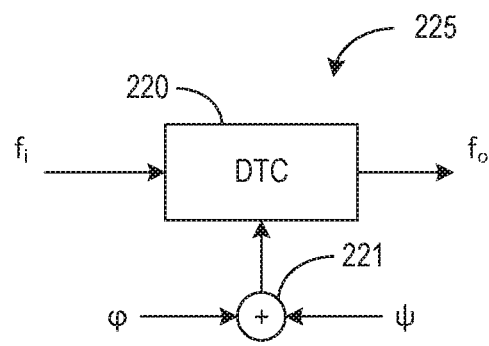

FIGS. 2A-2C illustrate generally a portion of an example frequency generation circuit 225 that can include a digital-to-time converter (DTC) 220 and a summing node 221. In certain examples, the DTC can receive an oscillator signal ($f_i$), for example, from a central frequency synthesizer or central frequency generator and can generate a output oscillator signal ($f_o$) having a different characteristics than the received oscillator signal ($f_i$). Referring to FIG. 2A, in certain examples, a second input signal from the summing node 221 can include a phase ramp ($\psi$) and the output oscillator signal ($f_o$) can have a frequency offset or shifted from the frequency of the input oscillator signal ($f_i$). Referring to FIG. 2B, in certain examples, the second input signal can include a phase modulation information ($\phi$) and the output oscillator signal ($f_o$) can be a modulated output signal having a nominal frequency the same as the input oscillator frequency. Referring to FIG. 2C, in certain examples, the second input signal can include a phase ramp ($\psi$) and phase modulation information ($\phi$), and the output oscillator signal ($f_o$) can be phase modulated and can have a frequency offset or shifted from the frequency of the input oscillator signal ($f_i$).

Figure 3:
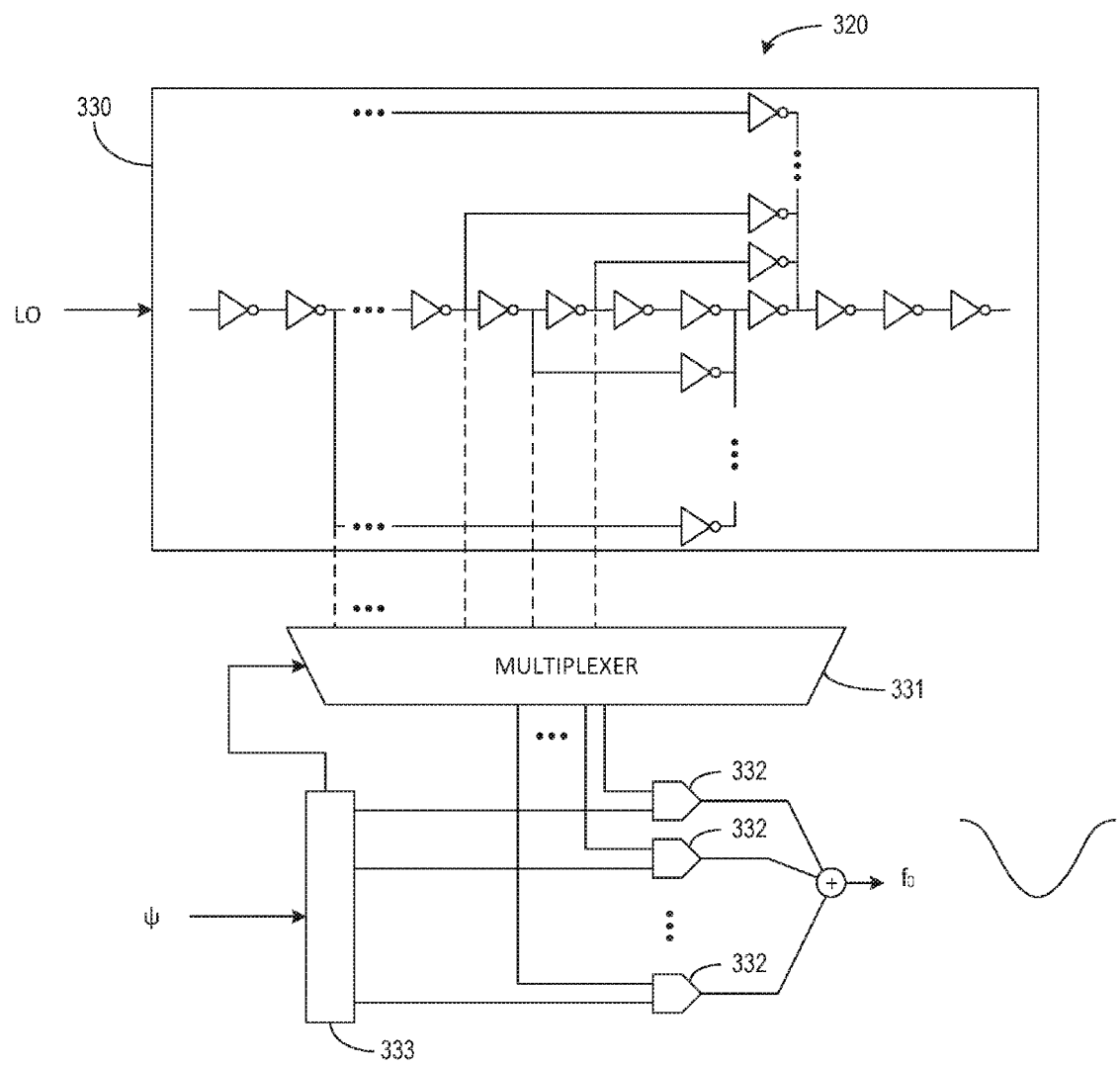
FIG. 3 illustrates generally an example DTC for generating an arbitrary oscillator signal from a central oscillator signal.

FIG. 3 illustrates generally an example DTC 320 for generating an arbitrary oscillator signal from a central oscillator signal. In certain examples, the DTC 320 can include an interpolated low latency delay line 330 or a ring oscillator configured to receive the central oscillator signal (LO). Taps of the delay line 330 or ring oscillator can be received at a multiplexer 331 configured to output one or more of the tap lines to provide a synthesized frequency signal. In certain examples, the DTC 320 can optionally include one or more current digital-to-analog converters (iDACs) 332. The iDACs can receive outputs of the multiplexer and can receive weight values from a controller. In such a configuration the weighted gain of the iDACS can allow suppression of phase noise at particular frequencies. In certain examples, phase ramp information ($\psi$) can be received by a controller 333 and can be used to control the selection of the multiplexer 331, weighting of the iDACs 332, or combinations thereof, to generate an arbitrary oscillator signal ($f_o$) having a desired frequency. In certain examples, the phase ramp information can be combined with phase modulation information to provide a modulated oscillator signal, for example, for a polar transmitter.

Figure 4:
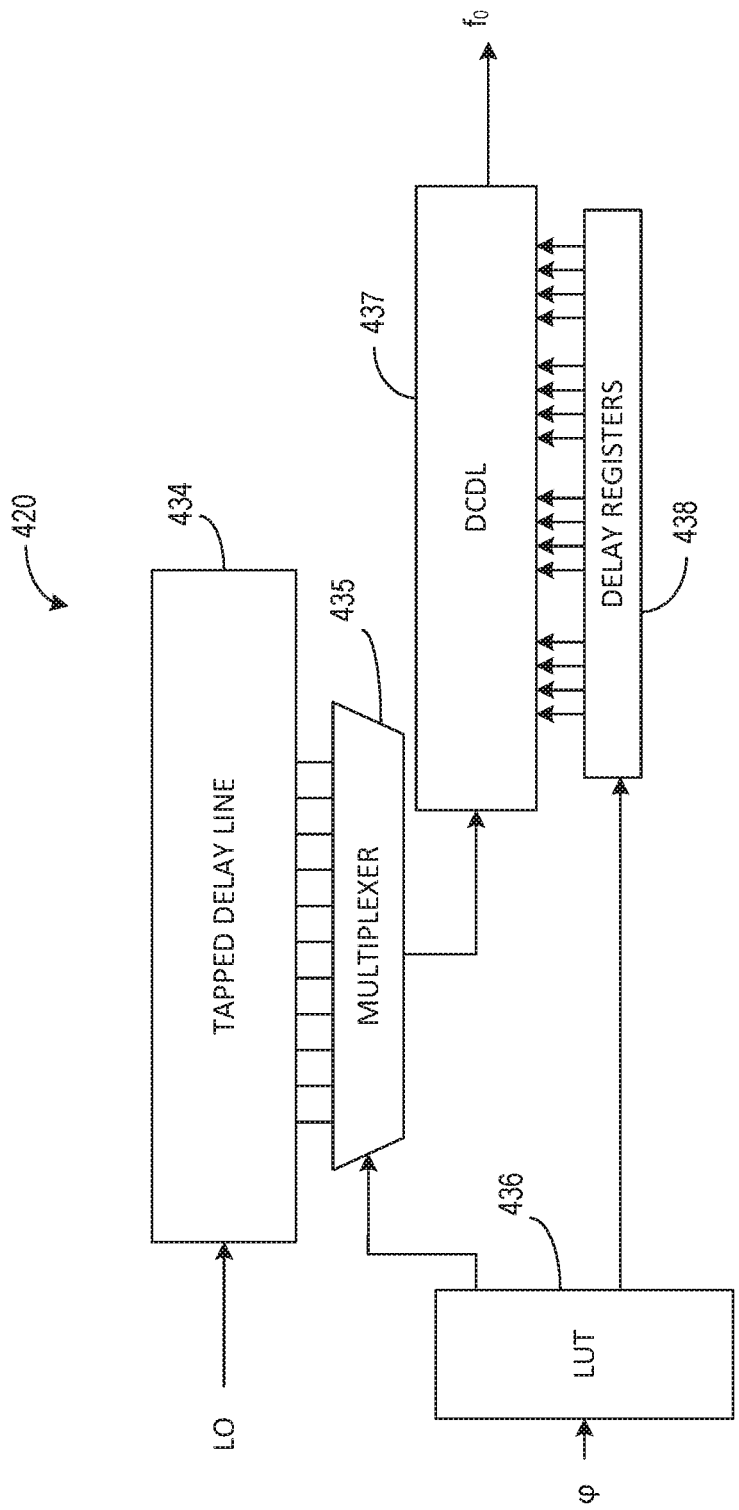
FIG. 4 illustrates an additional example of a DTC \for generating an output oscillator signal.

FIG. 4 illustrates an additional example of a DTC 420 for generating an output oscillator signal ($f_o$). In certain examples, the DTC 420 can include a tapped delay line (TDL) 434 for receiving a central oscillator signal (LO), a multiplexer 435, a lookup table 436 and a digitally controlled delay line (DCDL) 437. In certain examples, the lookup table 436 can decode phase modulation information ($\phi$) to provide coarse placement of signal edges of the output signal ($f_o$) using the TDL 434 and the multiplexer 435. In certain examples, the lookup table can decode the phase modulation information ($\phi$) to provide fine placement of signal edges of the output signal ($f_o$) using delay registers 438 coupled to the DCDL 437 to provide the desired phase modulation of the output signal ($f_o$). In certain examples, the DTC 420 can unwrap phase selection of the central oscillator signal (LO) thus providing more appropriate input edge selection that allows the DTC 420 to implement frequency multiplication or frequency division within the DTC 420. In certain examples, the phase modulation information ($\phi$) can include a phase ramp that can use the phase unwrapping of the DTC 420 such that the phase modulated output signal ($f_o$) provided by the DTC 420 includes a frequency different from the frequency of the central oscillator signal (LO). In certain examples, this arbitrary frequency generation feature can allow a wireless device to avoid frequency pulling problems where the powerful modulated output signal of a wireless device can pull or add phase noise to the local oscillator at or near the frequency of the output signal or a harmonic of the output signal. It is understood that other implementations of DTCs are possible without departing from the scope of the present subject matter, including, but not limited to, delay lines, dividers, delay interpolators or combinations thereof.

Figure 5:
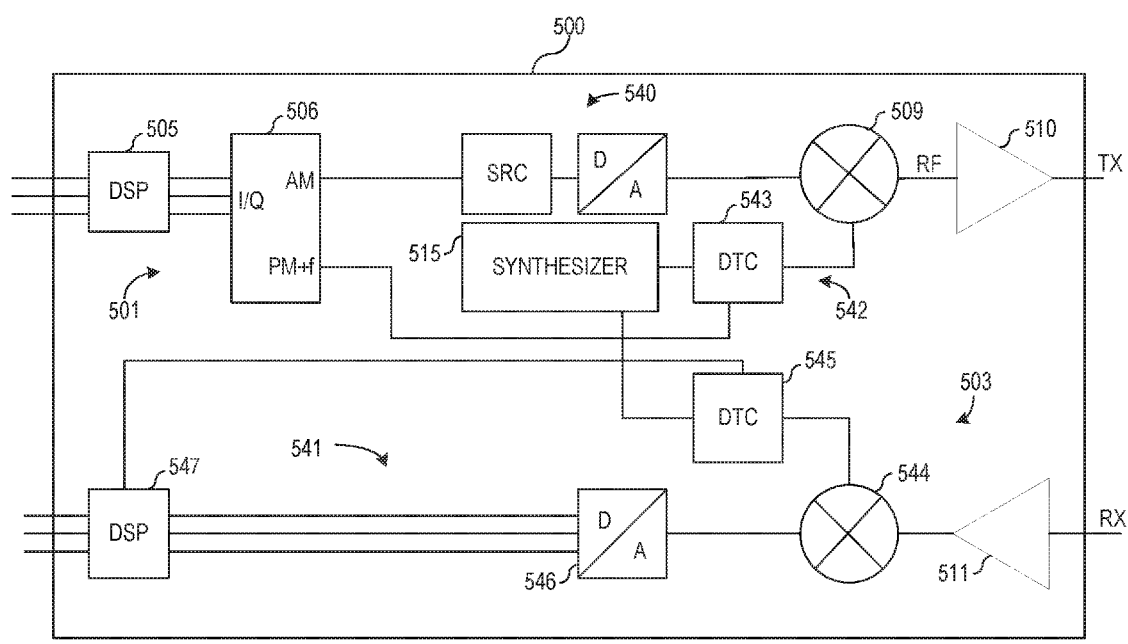
FIG. 5 illustrates generally an example central frequency synthesizer based transceiver.

FIG. 5 illustrates generally an example central frequency synthesizer based transceiver 500 for exchanging information between a processor of a wireless device and a processor of one or more other devices using a wireless network or communication link. The transceiver 500 can include transmitter 501 and a receiver 503. The transmitter 501 can include a processor 505, such as a digital signal processor (DSP), a transmitter 540 and a power amplifier 510. The processor 505 can receive transmit data from a host processor (not shown), such as a baseband processor of a cell phone, for example, and can provide transmit information to the polar transmitter 540. In certain examples, the transmitter 540 can process the transmit information to provide a modulated radio frequency (RF) signal to the power amplifier 510. The power amplifier 510 can amplify and process the RF signal for transmission using an antenna (not shown). In certain examples, the DTC-based frequency synthesis can receive phase ramp information to provide a particular radio frequency for transmission, reception or both transmission and reception. In some examples, such as for some polar transmitters, the DTC-based frequency synthesis can receive phase modulation information or a combination of phase modulation information and phase ramp information to provide a phase modulated signal at a particular radio frequency for transmission. In some examples, the transmitter can include a polar transmitter 540 and can include an amplitude processing path 541 for processing digital amplitude symbols of the transmit data and a phase processing path 542 for processing digital phase symbols of the transmit information. The phase processing path 542 can include a central frequency synthesizer 515, to provide central frequency information, and a transmitter DTC 543 to a particular frequency for the RF signal using the central frequency information or to provide the particular frequency and modulate the phase of the RF signal using the central frequency information. In certain examples, a mixer 509 can add the amplitude information to the envelope of the RF signal to provide the modulated RF signal. In certain examples, the polar transmitter 540 can include a cordic converter 506 to convert the transmit information of the DSP from Cartesian symbols (I, Q) to polar symbols (AM, PM+f). Although FIG. 5 illustrates a polar transmitter, the ability of implementing a DTC to provide frequency shifting, frequency modulation, or both frequency shifting and frequency modulation is not limited to only polar transmitters but other communication devices including receivers and other transmitters such as cartesian transmitters and out-phasing transmitters.

The receiver 503 can include an amplifier 511, demodulator 544, a receiver DTC 545, a analog-to-digital converter (ADC) 546 and a processor 547, such as a receiver DSP. In certain examples, an antenna coupled to the receiver 503 can receive a wireless signal. The amplifier 511 can amplify the wireless signal; or certain portions of the wireless signal.

The demodulator 544 can extract information from the wireless signal using a frequency provided by the receiver DTC 545. The ADC 546 can convert the information from an analog form to digital information for further processing by the processor 547. The processor 547 can provide at least a portion of the information to a host processor such as the baseband processor. In certain examples, the receiver DTC 545 uses the central frequency information generated by the central frequency synthesizer 515 to provide the demodulation frequency for the demodulator 544. In certain examples, pulling effects of the power amplifier 510 on the central frequency synthesizer 515 are significantly reduced or eliminated because the power amplifier 510 is prevented from coupling to the digitally implemented DTCs 543, 545 and there is no inductive coil as can be found with other architectures. In certain examples, the transmit DTC 543 and the receive DTC 545 can be employed to provide a frequency shift for generating transmit and receive frequencies. Exploiting this capability of the DTC allows transmission and reception frequencies to be different from the frequency of the central frequency synthesizer 515. Furthermore, in addition to eliminating a mechanism for allowing "pulling" of a transmitter or receiver local oscillator, the example architecture can unexpectedly provide real estate savings over traditional transceivers. Traditional transceivers typically have a local oscillator for each transmitter and receiver. Such oscillators can take up significant room on their own and then may require addition room to provide adequate separation between the oscillators or other components that can influence the frequency of the oscillators. The digital nature of the example architecture and the sharing of a central frequency synthesizer can eliminate the large components (e.g. coils) of the traditional local oscillator and can allow transmitter and receiver phase modulation to be done in a small, low -noise, digital environment.

Figure 6:
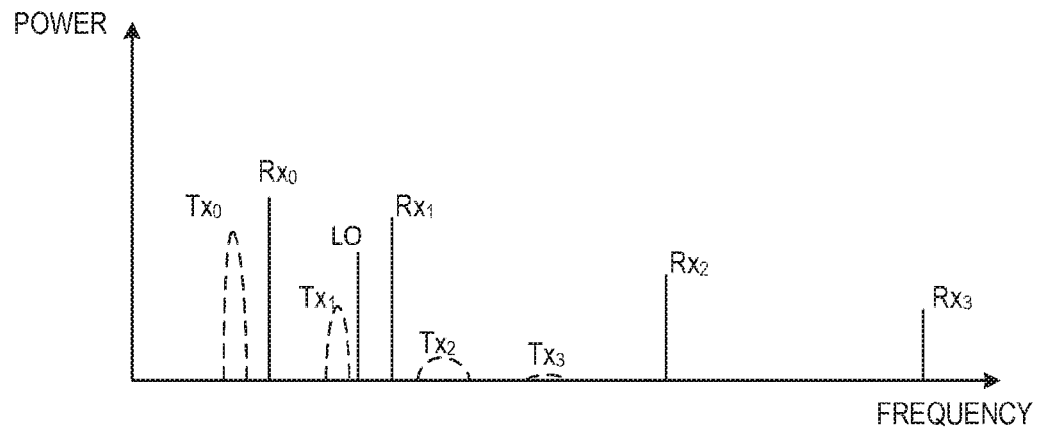
FIG. 6 illustrates graphically an example frequency plan of an example multi-radio device.

FIG. 6 illustrates graphically an example frequency plan of an example multi-radio device. The plan shows the relative separation of certain frequencies associated with the multi-radio device. The plan shows a transmitter frequency different ($Tx_0$) from a receiver frequency ($Rx_0$) and a frequency of the central frequency synthesizer (LO) different from both the transmitter frequency ($Tx_0$) and the receiver frequency ($Rx_0$). In addition, the plan illustrates that by exploiting the frequency shift capability of the DTCs, the frequency (LO) of the central frequency synthesizer can be selected to avoid harmonics ($Rx_{1-3}$, $Tx_{1-3}$) of the transmitter frequency ($Tx_0$), and the receiver frequency ($Rx_0$).

Figure 7:
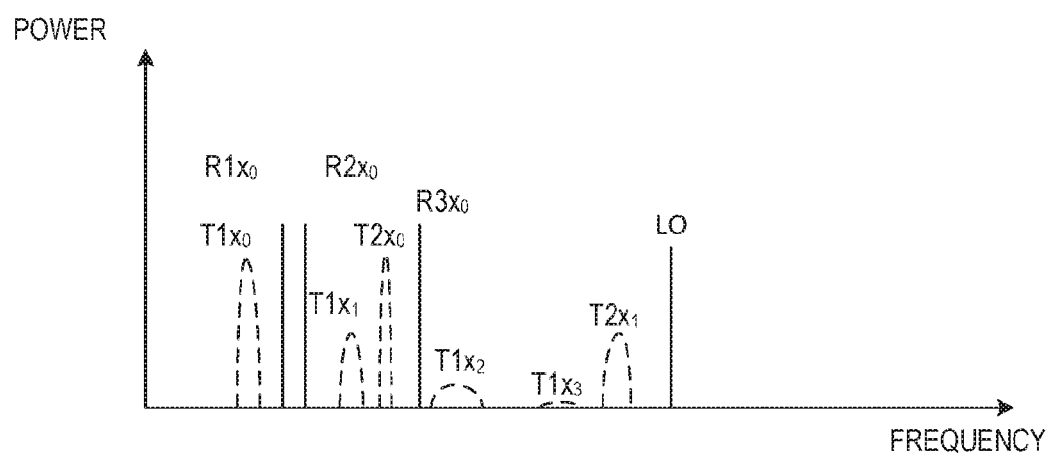
FIG. 7 illustrates graphically a frequency plan for a fraction DTC-based synthesizer such as the example fractional DTC-based synthesizer illustrated in FIG. 8.
Figure 8:
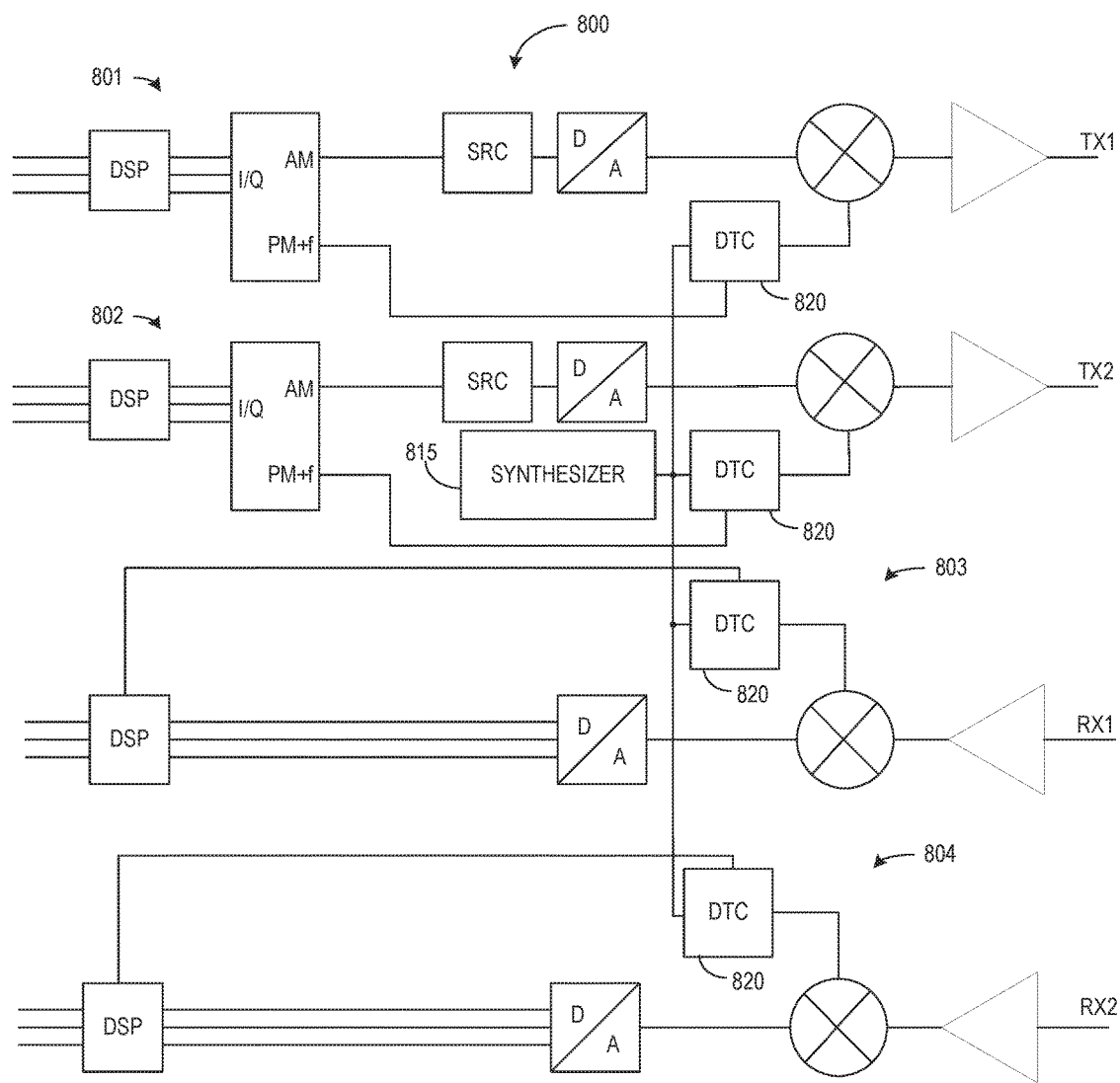
FIG. 8 illustrates an example communication module of a MIMO device including two transmitters and two receivers.

FIG. 7 illustrates graphically a frequency plan for a fractional DTC-based synthesizer such as the example synthesizer illustrated in FIG. 8. The frequency plan illustrated in FIG. 7 includes frequency bands for two transmitters and three receivers. Of interest in the frequency plan is that the receiver frequencies ($R1x_0$, $R2x_0$, $R3x_0$) do not overlap the transmitter frequencies ($T1x_0$, $T2x_0$) or any of the transmitter frequency harmonics ($T1x_{1-3}$, $T2x_1$). Nor do any of the frequencies (R1x0, R2x0, R3x0, T1x0, T2x0) or harmonics ($T1x_{1-3}$, $T2x_1$) overlap the frequency (LO) of the central frequency synthesizer. Such a configuration provides significant resistance to "pulling" between the transmitters and receivers.

FIG. 8 illustrates an example communication module 800 of a MIMO device including two transmitters 801, 802 and two receivers 803, 804. The communication module 800 can include a central frequency synthesizer 815 for generating central frequency information. The central frequency information can be used by a DTC 820 of each transmitter 801, 802 and receiver 803, 803 to develop the local oscillator signal for modulation or demodulation. The example architecture of FIG. 8 can be extended to include additional transmitters and receivers. Devices implementing simultaneous wireless communication standards can make space efficient use of the example architecture shown in FIG. 8. Such standards or protocols can include, but are not limited to Bluetooth, Wi-Fi, GPS, CR, etc.

In certain examples, a central synthesizer architecture can provide the opportunity to optimize the frequency of the central synthesizer. For example, the central synthesizer frequency can be selected to minimize cross talk between different device systems implemented or operated simultaneously in a mobile phone. In certain examples, the example central frequency synthesizer architecture can allow power scaling based on performance requirements of a certain RF mode. For example, current allocation and resolution, for example of one or more DTCs, can be adjusted depending on the operating mode of one or more of the radios of a mobile device. More specifically, for example, current consumption and DTC resolution can be decreased if a MIMO device is operating in a Bluetooth-only mode, Emerging radio standards or protocols for connectivity (e.g., 802.11ac) and cellular(e.g., LTE-Rel10 and beyond) can incorporate contiguous and non-contiguous channel bonding/carrier aggregation features to support wide effective channel bandwidths while maintaining backward compatibility with legacy networks and existing spectrum allocation. This incorporation can allow peak data rates on the order of 100 Mbps-5 Gbps, and higher, to be supported on the up-links and down-links to mobile devices. In certain examples, architecture according to the present subject matter can allow mobile devices to also support transmit (TX) multi-input, multi-output (MIMO) capabilities to further improve channel capacity in these standards.

Digital polar transmitters are a promising approach for radio implementations on low-cost SoC CMOS because they can offer the potential for higher efficiency, minimize the required number of area-intensive passives, and port easily to new process nodes. PLL based phase modulators are typically used to generate the desired TX signals but suffer limitations when used for wider bandwidth (e.g., >20 MHz) signals. Carrier aggregation can simultaneously generate transmit signals at non-harmonically related channel frequencies. Since, the spectrum allocation for cellular services varies by geography, a "world-phone" may need to generate transmit signals in many different bands, even if they do not need to operate simultaneously. Generating these modulated transmit signals in multiple independent PLLs, one for each carrier frequency, can result in significant area and power penalties. With the integration of power amplifier (PA) on the same die as the RF transceiver, the oscillator in each PLL can experience "pulling" from the high power modulated PA outputs. PA LO pulling (re-modulation) can result in degraded modulation quality and spectral performance. This problem can be exacerbated with TX-MIMO, where the multiple independently modulated PAs at the same frequency can pull the TX modulation PLLs. The oscillators in the PLLs for each MIMO or carrier aggregation branch can pull one another as well.

Existing or proposed schemes to alleviate pulling by shifting the oscillator frequency from the power amplifier output, such as dividing-and-mixing or harmonic division, can require area intensive passive filters such as inductive-capacitive (LC) filters. Such schemes may not be immune to harmonic pulling and do not scale well as the number of carrier frequencies increase. All digital local oscillator schemes can separate the power amplifier output from the local oscillator frequency without including passive filters but still consume substantial chip area and power.

A conventional solution for carrier aggregation and MIMO is to generate multiple transmission signals using multiple phased-locked loops, one for each frequency band that is supported whether the bands are used concurrently or not. Such solutions use significant circuit area and power and are susceptible to pulling, sometimes referred to as re-modulation, from the multiple local oscillator signals and harmonics thereof.

Figure 9:
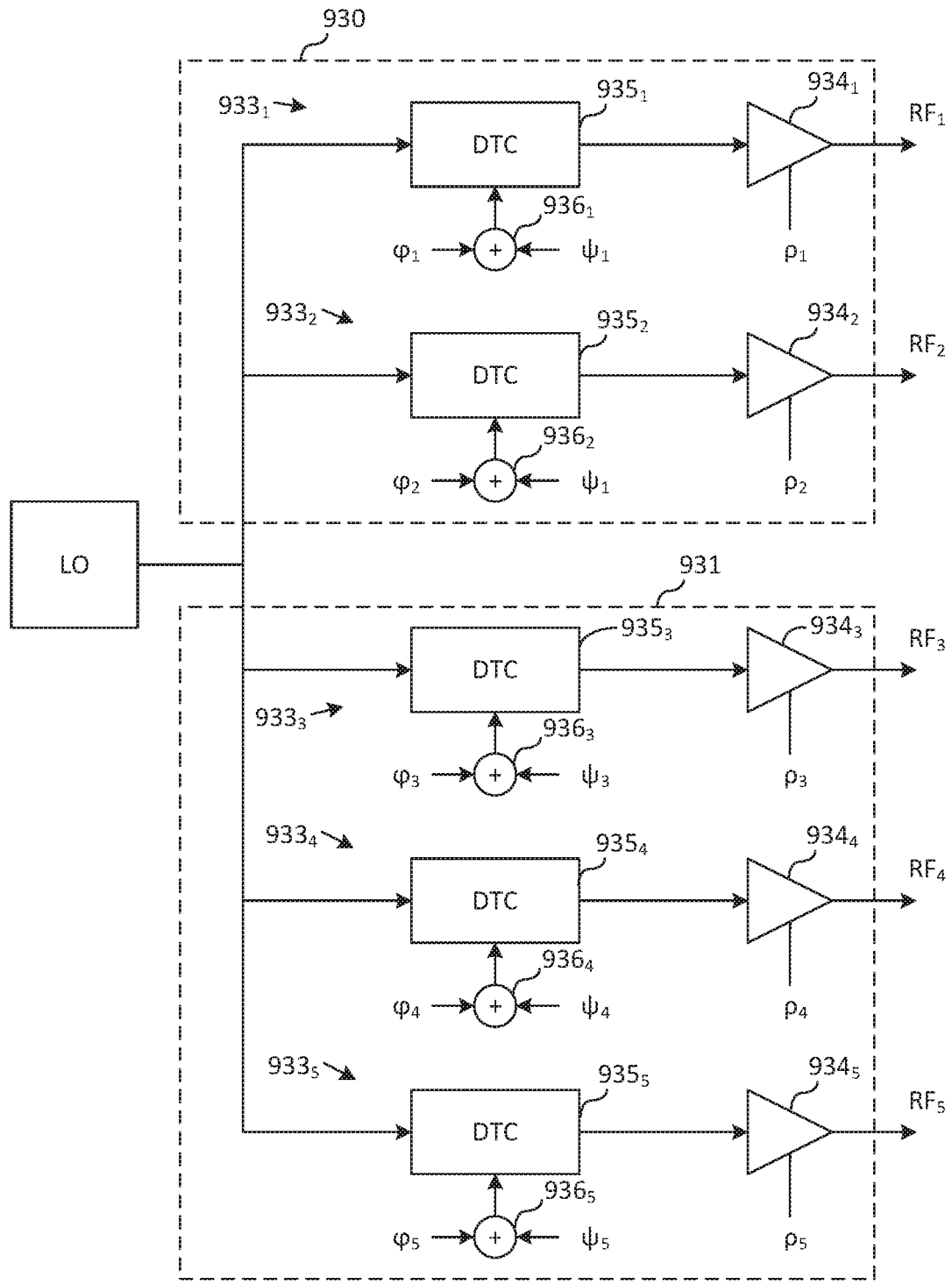
FIG. 9 illustrates generally an example communication device including a MIMO stack and carrier aggregation section.

FIG. 9 illustrates generally an example communication device 900 including a MIMO stack 930 and carrier aggregation section 931 that can alleviate power amplifier pulling and other forms of frequency pulling. The shared local oscillator (LO) scheme can provide pulling immune, low-power, and area efficient transmitters that can allow carrier aggregation and transmit MIMO support, such as IEEE 802ac, LTE, LTE-Advanced and future high data rate wireless standard radios. In certain examples, the shared local oscillator (LO) scheme conserves power by introducing phase shifts in the same phase modulator used for the transmitter.

The MIMO stack 930 and the carrier aggregation section 931 can include multiple transmitters $933_n$. In certain examples, each transmitter $933_n$ can be a digital polar transmitter including a power amplifier $934_n$, a DTC $935_n$, and a summing junction $936_n$. The summing junction $936_n$ can receive phase modulation information ($\phi_n$) and a phase ramp ($\psi_n$). The DTC $935_n$ can provide a phase modulated signal having a frequency different from a signal received from a local oscillator (LO) using the phase modulation information ($\phi_n$) and the phase ramp ($\psi_n$). In certain example, the power amplifier $934_n$ can add amplitude information ($\rho_n$) to the envelope of the phase modulated signal of the DTC $935_n$ to provide a radio frequency signal $RF_n$ to drive one or more antennas In certain examples, a MIMO stack 930 can provide multiple modulated signals using a common frequency. As illustrated, a first DTC $935_1$ and a second DTC $935_2$ of the MIMO stack 930 can receive the same phase ramp ($\psi_1$) but different phase modulation information ($\phi_1$, $\phi_2$). Each DTC $935_1$, $935_2$ can provide a phase modulated signal to a respective power amplifier $934_1$, $934_2$. Each power amplifier $934_1$, $934_2$ can add amplitude information ($\rho_1$, $\rho_2$) to the respective phase modulated signal and can provide a radio frequency drive signal ($RF_1$, $RF_2$) for an antenna.

In certain examples, a carrier aggregation section 931 can include three transmitters $933_3$, $933_4$, $933_5$. Each DTC $935_3$, $935_4$, $935_5$ can receive different phase modulation information ($\phi_3$, $\phi_4$, $\phi_5$) and different phase ramp information ($\psi_3$, $\psi_4$, $\psi_5$) to produce three different phase modulated signal, each having a different frequency offset from the frequency of the local oscillator (LO). In addition, each power amplifier $934_3$, $934_4$, $934_5$ of each of the carrier aggregation section transmitters $933_3$, $933_4$, $933_5$ can receive different amplitude information $\rho_3$, $\rho_4$, $\rho_5$) for providing a radio frequency signal ($RF_3$, $RF_4$, $RF_5$) for driving an antenna.

In certain examples, the open loop DTCs $935_n$ can receive a phase ramp ($\psi_n$) to offset the output frequency from the frequency of the local oscillator (LO) and thereby absorb the function of a conventional fractional multiplier/divider. The range of frequency fractionalities synthesized using a DTC can be set by the resolution of the DTC, and the output frequency range of the DTC can be determined by the maximum instantaneous frequency jump the DTC can handle. In certain examples, additional integer frequency dividers can expand the flexibility of the architecture to cover a wide range of bands without being susceptible to frequency pulling. It is understood that the illustrated example can include additional transmitters as well as corresponding receivers, as is discussed above with respect to FIG. 8, without departing from the scope of the present subject matter. In some examples, one or more of the DTCs $935_n$, or additional DTCs associated with one or more receivers, can optionally receive only phase ramp information, such as is shown in FIG. 2A, to shift the local oscillator (LO) frequency and to provide a particular frequency for a transmitter or a receiver.

Figure 10:
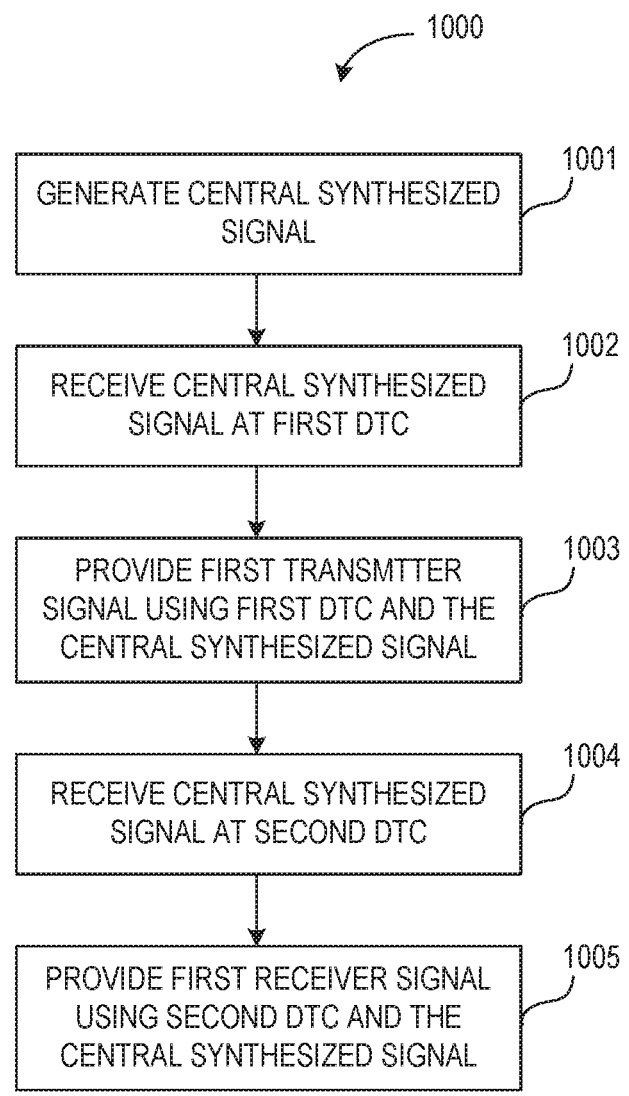
FIG. 10 illustrates generally an example method of using a central frequency synthesizer.

FIG. 10 illustrates generally an example method 1000 of using a central frequency synthesizer. At 1001, a central frequency synthesizer, such as a single phase-locked loop (PLL), can generate a central synthesized signal. At 1002, a first DTC can receive the central synthesized signal. At 1003, the first DTC can provide a first transmitter signal using the central synthesized signal. In certain examples, the frequency of the first transmitter signal can be different than the frequency of the central synthesized signal and integer harmonics of the central synthesized signal to, for example, prevent frequency pulling. At 1004, a second DTC can receive the central synthesized signal. At 1005, the second DTC can provide a first receiver signal using the central synthesized signal. In certain examples, the frequency of the first receiver signal can be different than one or more of the frequency of the central synthesized signal, integer harmonics of the central synthesized signal, and the frequency of the first transmitter signal.

Additional Notes

In Example 1, an apparatus can include a central frequency synthesizer configured to provide a central oscillator signal having a first frequency, a first transmitter, the first transmitter including a first transmit digital-to-time converter (DTC) configured to receive the central oscillator signal and to provide a first transmitter signal having a second frequency, and a first receiver, the first receiver including a first receive DTC configured to receive the central oscillator signal and to provide a first receiver signal having a first receive frequency. In certain examples, the second frequency can be different from the first frequency In Example 2, the first transmitter of Example 1 optionally is configured to process and transmit first information according to a first communication protocol, and the first receiver of Example 1 optionally is configured to receive and process second information according to the first communication protocol.

In Example 3, the apparatus of any one or more of Examples 1-2 optionally includes a second transmitter, the second transmitter including a second transmit DTC, the second transmit DTC configured to receive the central frequency and to provide a second transmitter signal.

In Example 4, the second transmitter of any one or more of Examples 1-3 optionally is configured to process and transmit third information according to a communication protocol different from the first communication protocol.

In Example 5, the first transmit DTC of any one or more of Examples 1-4 optionally is configured to receive first phase ramp information and to provide the first transmitter signal having the second frequency using the first phase ramp information.

In Example 6, the second transmit DTC of any one or more of Examples 1-5 optionally is configured to receive second phase ramp information and to provide the second transmitter signal using second phase ramp information.

In Example 7, the first phase ramp information and the second phase ramp information of any one or more of Examples 1-6 optionally are the same.

In Example 8, the first phase ramp information and the second phase ramp information of any one or more of Examples 1-6 optionally are different.

In Example 9, the first frequency of any one or more of Examples 1-8 optionally is different from the second frequency.

In Example 10, the first frequency of any one or more of Examples 1-9 optionally is different from the first receive frequency.

In Example 11, the second frequency of any one or more of Examples 1-10 optionally is different from the first receive frequency.

In example 12, the second frequency and the first receive frequency of any one or more of Examples 1-11 optionally are different from an integer harmonic frequency of the first frequency.

In Example 13, the first transmitter signal of any one or more of Examples 1-12 optionally includes a first modulated signal, and the first DTC of any one or more of Examples 1-12 optionally is configured to receive first phase ramp information and phase modulation information and to provide the first modulated signal using the first phase ramp information and the phase modulation information.

In Example 14, a method can include generating a central synthesized signal for a plurality of communication circuits of an electronic device using a central frequency synthesizer, receiving the central synthesized signal at a first digital-to-time converter (DTC) of a first transmitter of the plurality of communication circuits, providing a first transmitter signal having a first transmitter frequency different from a nominal frequency of the central synthesized signal using the first DTC, receiving the central synthesized signal at a second DTC of a first receiver of the of the plurality of communication circuits, and providing a first receiver signal having a first receiver frequency different from the nominal frequency of the central synthesized signal using the second DTC.

In Example 15, the method of any one or more of Examples 1-14 optionally includes receiving the central synthesized signal at a third DTC, and providing a second transmitter signal having a third frequency using the third DTC. In certain examples, a second transmitter of the plurality of communication circuits can optionally include the third DTC.

In Example 16, the method of any one or more of Examples 1-15 optionally includes processing first transmission data according to a first communication protocol using the first transmitter, and processing second transmission data according to a second communication protocol using the second transmitter.

In Example 17, the first communication protocol of any one or more of Examples 1-16 optionally is different from the second communication protocol.

In Example 18, the method of any one or more of Examples 1-17 optionally includes receiving communication data from an antenna coupled to the first receiver, and processing the communication data according to the first communication protocol.

In Example 19, the first frequency of any one or more of Examples 1-18 optionally is different from the third frequency.

In Example 20, the second frequency of any one or more of Examples 1-19 optionally is different from the third frequency.

In Example 21, an integer harmonic frequency of the nominal frequency of any one or more of Examples 1-20 optionally is different from the first frequency, the second frequency, and the third frequency.

In Example 22, the providing the first transmitter signal of any one or more of Examples 1-21 optionally includes receiving first phase ramp information at the first DTC.

Example 23, the providing the second transmitter signal of any one or more of Examples 1-22 optionally includes receiving second phase ramp information at the third DTC.

In Example 24, the first phase ramp information of any one or more of Examples 1-23 optionally is the same as the second phase ramp information.

In Example 25, the first phase ramp information of any one or more of Examples 1-24 optionally is different from the second phase ramp information.

In Example 26, a mobile electronic device can include a processor, and a wireless communication system configured to exchange information with the processor and one or more other mobile electronic devices. The wireless communication system can include a central frequency synthesizer configured to provide a central synthesized signal having a first frequency, a first wireless transmitter including a first transmitter DTC, the first DTC configured to receive the central synthesized signal and to provide a first transmitter signal having a first transmitter frequency, and a wireless receiver including a receiver DTC, the receiver DTC configured to receive the central oscillator signal and to provide a first receiver signal having a receiver frequency.

In Example 27, the first DTC of any one or more of Examples 1-26 optionally is configured to receive first phase ramp information to provide the first transmitter signal using the first phase ramp information the central synthesized signal.

In Example 28, the mobile electronic device of any one or more of Examples 1-14 optionally includes a second transmitter having a second transmitter DTC, the second transmitter DTC configured to receive the central synthesized signal and to provide a second transmitter signal having a second transmitter frequency.

In Example 29, the second transmitter DTC of any one or more of Examples 1-28 optionally is configured to receive second phase ramp information to provide the second transmitter signal using the second phase ramp information and the central synthesized signal.

In Example 30, the first phase ramp information of any one or more of Examples 1-31 optionally is different from the second phase ramp information.

In Example 31, a digital-to-time converter (DTC) can include a delay element configured to receive a periodic input signal and to provide a plurality of output phases using the periodic input signal, a multiplexer configured to receive selection information from a controller and to couple one or more of the plurality of output phases to an output of the multiplexer using the selection information, and a plurality of digital-to-analog converters (DACs) coupled to the output of the multiplexer, to receive weight information from the controller, and to provide a plurality of analog signals representative of an output signal.

In Example 32, the DACs of any one or more of Examples 1-31 optionally include current ADCs (iDACs) configured to provide a plurality of analog current signals representative of the output signal.

In Example 33, the DTC of any one or more of Examples 1-32 optionally includes a summing node configured to sum the plurality of analog current signals and to provide the output signal.

In Example 34, the selection information of any one or more of Examples 1-33 optionally includes phase ramp information configured to shift a frequency of the output signal away from a frequency of the periodic input signal.

In Example 35, the selection information of any one or more of Examples 1-34 optionally includes phase modulation information configured to provide phase modulation of the output signal.

In Example 36, weight information of any one or more of Examples 1-35 optionally is configured to suppress noise at one or more a frequencies of the output signal.

In Example 37, the delay element of any one or more of Examples 1-36 optionally includes a delay line.

In Example 38, the delay element of any one or more of Examples 1-37 optionally includes a divider circuit.

In Example 39, the delay element of any one or more of Examples 1-38 optionally includes an delay interpolator.

Example 40 can include, or can optionally be combined with any portion or combination of any portions of any one or more of Examples 1 through 39 to include, subject matter that can include means for performing any one or more of the functions of Examples 1 through 39, or a machine-readable medium including instructions that, when performed by a machine, cause the machine to perform any one or more of the functions of Examples 1 through 39.

The above detailed description includes references to the accompanying drawings, which form a part of the detailed description. The drawings show, by way of illustration, specific embodiments in which the invention can be practiced. These embodiments are also referred to herein as "examples." All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. An apparatus comprising:
   an oscillator configured to provide an oscillator signal having an oscillator frequency;
   a first transmitter including a first transmit digital-to-time converter (DTC) configured to receive the oscillator signal and to provide a first transmit signal having a first transmit frequency;
   a first receiver, the first receiver configured to receive the oscillator signal and to provide a first receiver signal having a first receive frequency; and
   wherein each of the oscillator frequency, the first transmit frequency and the first receive frequency is a different frequency than each other frequency of the oscillator frequency, the first transmit frequency and the first receive frequency.

2. The apparatus of claim 1, wherein the first transmitter includes a modulator configured to receive first modulation information and to provide the first transmit signal using the first modulation information.

3. The apparatus of claim 2, wherein the modulator includes a Cartesian modulator configured to receive Cartesian symbols and to provide the first transmit signal using the Cartesian symbols.

4. The apparatus of claim 2, wherein the first transmit DTC is the modulator and is configured to receive phase modulation information and to provide the first transmit signal using the phase modulation information.

5. The apparatus of claim 1, wherein the first transmit DTC is configured to receive first phase ramp information and to provide the first transmit signal having the first transmit frequency using the first phase ramp information.

6. The apparatus of claim 1, wherein the first transmitter is configured to process and transmit first information according to a first communication protocol; and
   wherein the first receiver is configured to receive and process second information according to the first communication protocol.

7. The apparatus of claim 6, including a second transmitter, the second transmitter including a second transmit DTC, the second transmit DTC configured to receive the oscillator signal and to provide a second transmit signal.

8. The apparatus of claim 7, wherein the second transmitter is configured to process and transmit third information according to a communication protocol different from the first communication protocol.

9. The apparatus of claim 7, wherein the second transmit DTC is configured to receive second phase ramp information and to provide the second transmit signal having a second transmit frequency using the second phase ramp information.

10. The apparatus of claim 9, wherein the first phase ramp information and the second phase ramp information are the same phase ramp information.

11. The apparatus of claim 9, wherein the first phase ramp information and the second phase ramp information are different phase ramp information.

12. The apparatus of claim 9, wherein the oscillator frequency is different from the second transmit frequency.

13. The apparatus of claim 9, wherein the second transmit frequency is different from the first receive frequency.

14. The apparatus of claim 13, wherein the second transmit frequency and the first receive frequency are different than an integer harmonic frequency of the oscillator frequency.

15. A non-transitory machine-readable medium including instructions that, when performed by a machine, cause the machine to:
- generate an oscillator signal having and oscillator frequency using a central frequency synthesizer;
- receive the oscillator signal at a first digital-to time converter (DTC) of a first transmitter;
- provide a first transmit signal having a first transmit frequency using the first DTC;
- receive the oscillator signal at a second DTC of a first receiver;
- provide a first receiver signal having a first receive frequency using the second DTC; and
- wherein each of the oscillator frequency, the first transmit frequency and the first receive frequency is a different frequency than each other frequency of the oscillator frequency, the first transmit frequency and the first receive frequency.

16. The non-transitory machine-readable medium of claim 15, including instructions that, when performed by the machine, cause the machine to:
- receive first modulation information at a modulator of the first transmitter; and
- provide the first transmit signal using the first modulation information.

17. The non-transitory machine-readable medium of claim 16, wherein the modulator includes a Cartesian modulator; and
- wherein the non-transitory machine-readable medium includes instructions that, when performed by the machine, cause the machine to receive Cartesian symbols and to provide the first transmit signal using the Cartesian symbols.

18. The non-transitory machine-readable medium of claim 16, wherein the first transmit DTC is the modulator; and
- wherein the non-transitory machine-readable medium includes instructions that, when performed by the machine, cause the machine to receive phase modulation information and to provide the first transmit signal using the phase modulation information.

19. The non-transitory machine-readable medium of claim 15, including instructions that, when performed by the machine, cause the machine to:
- receive first phase ramp information at the first transmit DTC;
- provide the first transmit signal having the first transmit frequency using the first phase ramp information.

20. The non-transitory machine-readable medium of claim 15, wherein the first transmit frequency and the first receive frequency are different than an integer harmonic frequency of the oscillator frequency.

\* \* \* \* \*